United States Patent [19]

Hartman

[11] 4,019,113
[45] Apr. 19, 1977

[54] ENERGY CONVERSION DEVICE

[76] Inventor: James Keith Hartman, 664 South St., East Aurora, N.Y. 14052

[22] Filed: Nov. 20, 1974

[21] Appl. No.: 525,509

[52] U.S. Cl. .................................. 321/1.5; 357/28; 357/87
[51] Int. Cl.² .......................................... H02M 7/00
[58] Field of Search ................. 321/1.5; 357/28, 87

[56] References Cited

UNITED STATES PATENTS

| 2,758,146 | 8/1956 | Lindenblad | 357/28 |
| 2,881,594 | 4/1959 | Hopkins | 321/1.5 X |
| 2,896,005 | 7/1959 | Fritts et al. | 357/87 |
| 3,127,287 | 3/1964 | Henderson et al. | 357/87 |
| 3,200,259 | 8/1965 | Braunstein | 357/33 X |
| 3,211,586 | 10/1965 | McCoy et al. | 357/87 X |
| 3,342,646 | 9/1967 | Dingwall et al. | 357/28 |
| 3,397,370 | 8/1968 | Biet et al. | 357/28 X |
| 3,400,015 | 9/1968 | Chapman | 357/28 X |
| 3,524,771 | 8/1970 | Green | 357/28 |
| 3,566,512 | 3/1971 | Lane | 357/87 X |

Primary Examiner—William M. Shoop
Attorney, Agent, or Firm—George E. Clark

[57] ABSTRACT

An energy conversion device is described which efficiently converts thermal energy to electrical energy or electrical energy to thermal energy through the mechanism of a structure which includes a first element (cathode), usually a metal, a second material such as an insulator or a semiconductor providing a voltage barrier and a conduction band, and a third material (anode), usually a metal, where the voltage barrier between the first element and the second element is greater than the voltage barrier between the second element and the third element. In some metals, work function is a relative indicator of voltage barrier heights and may be used as a criterion for selection of metals for the first and third elements, once the second element has been chosen. Thermal energy impinging upon the cathode causes electrons emitted from the cathode to exceed the voltage barrier between the cathode and the semiconductor or insulating material and jump into the conduction band of such semiconductor or insulating material. This causes electrons already injected into such conduction band to be displaced and to fall to the anode causing a current to flow through a load device connected between the cathode and the anode. Conversely, electrical energy input can be made to cool the anode by forcing electrons to move in a reverse direction through the diode. This current flow through the diode causes thermal energy to be liberated at the cathode.

14 Claims, 7 Drawing Figures

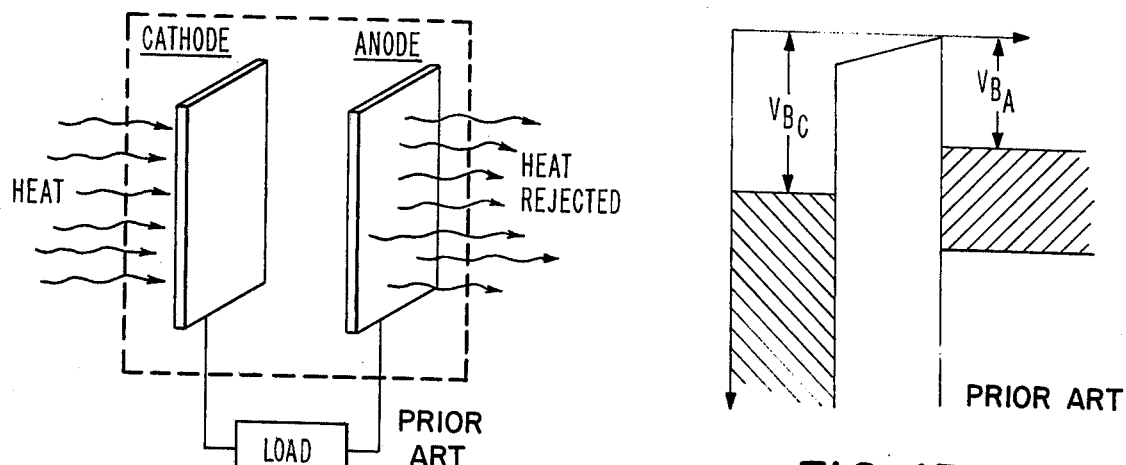
FIG. 1A
FIG. 1B
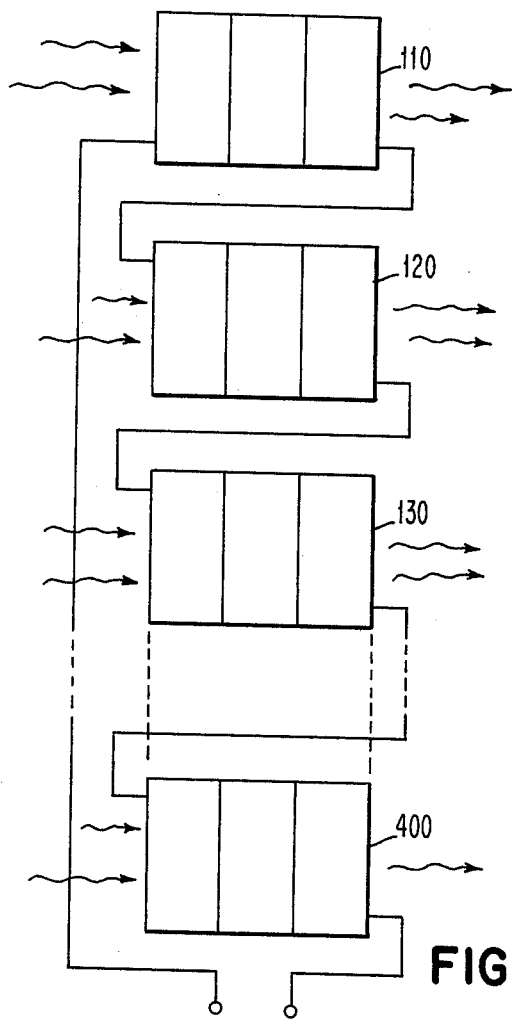
FIG. 5

ENERGY CONVERSION DEVICE

BACKGROUND OF THE INVENTION

1. Field of the Invention

The present invention relates to energy conversion devices and more particularly to devices for converting between thermal and electrical energy through the use of semiconductor or insulator and conductor structures.

2. Description of the Prior Art

In the prior art, there are many devices which convert thermal energy to electrical energy.

One such device is the thermionic converter. The thermionic converter generally comprises a cathode made from a highly emissive material or composition of material, an evacuated space or a low pressure gas plasma filled space and an anode for collecting electrons emitted by the cathode.

The efficiency of thermionic converters is generally low, in the order of 10 to 20 percent, and the lifetime is limited, based upon the capacity of the cathode to emit electrons and remain stable at the high temperatures required for operation.

While there are in the prior art some thermionic diodes which use semiconductor material, the semiconductor material, in the past, has been used to enhance the electron emissive capability of the cathode structure of the thermionic device.

SUMMARY OF THE INVENTION

It is, therefore, a primary object of the present invention to efficiently convert thermal energy to electrical energy or electrical energy to thermal energy.

It is another object of the present invention to efficiently convert thermal energy to electrical energy with an energy conversion diode which uses the conduction band of a semiconductor or insulator material for electron transfer to reduce unnecessary heat loss from the cathode in conversion and thus improve conversion efficiency.

It is a still further object of the present invention to convert thermal energy to electrical energy by an energy conversion diode in which an insulator or semiconductor material, in which the conduction band permits electrons to pass, is used to create a barrier between two metals, wherein there is a relatively high voltage barrier between the first metal (cathode) and the insulator or semiconductor material and a relatively low voltage barrier between the insulator or semiconductor material and the second metal (anode).

Yet another object of the present invention is to convert electrical energy to thermal energy by a reversible energy conversion device constructed from a first metal, which operates as a cathode in a thermal to electrical energy conversion and receives electrons in the electrical to thermal energy conversion, a semiconductor or insulator material, and a second metal, which operates as an anode in the thermal energy to electrical energy conversion and emits electrons in the electrical energy to thermal energy conversion.

Accordingly, the present invention relates to an energy conversion diode which achieves a high efficiency of energy conversion whether converting thermal energy to electrical energy or electrical energy to thermal energy.

A diode, according to the present invention, includes a first element (cathode) having a partially filled conduction band, a second element which may be either an insulating material or a semiconductor, there being a voltage barrier along a common surface between the first and second elements, and a third element (anode) having a partially filled conduction band, the third element being joined to the second element along a second surface, there being a second voltage barrier between the second and third elements, the voltage barrier between the first and second elements being greater than the voltage barrier between the second and third elements. Thermal energy impinging upon the first element causes electrons to be raised in energy. The electrons then pass through the conduction band of the insulator or semiconductor material and are collected by the third element. A load device is connected between the anode and cathode of the diode.

By applying a potential across the diode, heat is absorbed by the anode, carried to the cathode by the electron flow, and radiated by the cathode. In this mode, the device performs the function of a heat pump.

It is a feature of the present invention that energy conversion diodes constructed according to the present invention may be connected in various series, parallel, or series-parallel configurations to achieve any desired voltage, current or power output for powering electrical loads.

It is an advantage of the present invention that energy conversion devices constructed according to the present invention may be operated at much lower temperatures than prior art thermionic converters.

For example, thermionic converters normally operate in the range of 2000° Kelvin (2000° K) while an energy conversion device according to the present invention operates efficiently in the range of 500° Kelvin (500° K).

It is another advantage of the present invention that due to the lower operating temperatures, the materials of the anode and cathode last much longer. There is also the advantage of being able to control the cathode-anode spacing accurately and rigidly by the presence of the insulator or semiconductor.

A still further advantage of the present invention is that there is a much greater flexibility available to a designer in selecting operating conditions as far as required temperatures, current output and voltage output by proper selection of the materials for the cathode, anode and semiconductor or insulating barrier.

Other objects, features and advantages of the present invention will become readily apparent from the following description of preferred embodiments of the invention considered in conjunction with the drawings.

DETAILED DESCRIPTION OF THE DRAWINGS

FIG. 1A is a schematic view of a PRIOR ART thermionic converter in which the emitting and collecting electrodes are contained in a vacuum space.

FIG. 1B is an energey diagram of the prior art thermionic converter of FIG. 1A showing the barrier voltage which must be exceeded by emitted electrons from the cathode element to achieve current flow through the vacuum to the collector element.

FIG. 5 is a schematic diagram of an interconnection of a plurality of energy conversion diode to achieve a device having substantial power output.

DESCRIPTION OF PREFERRED EMBODIMENT

Figure 2:
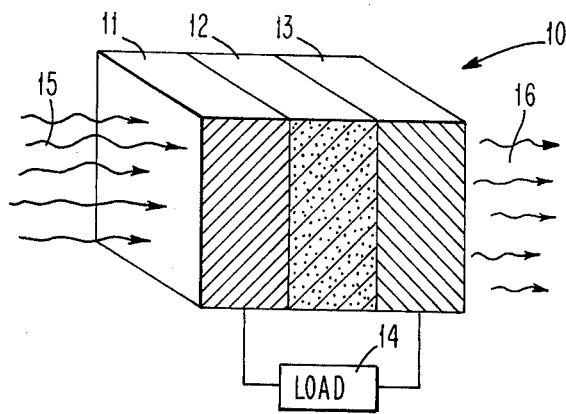
FIG. 2 is an isometric view which shows schematically the structure of an energy conversion diode emobodying the present invention.
Figure 3:
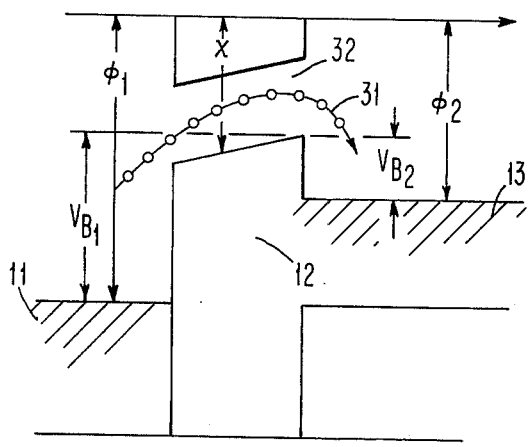
FIG. 3 is an energy diagram for an energy conversion diode according to the present invention operating as a thermal to electrical energy converter.

Referring now to FIGS. 2 and 3, the present invention will be described with reference to a preferred embodiment thereof. An energy conversion diode 10 is constructed of a relatively high work function metal 11 such as gold, palladium, silver, platinum, iridium, and rhenium; a semiconductor material 12 such as silicon, gallinium phosphide or gallinium arsenide phosphide, or if an insulator is used element 12 may be any insulating material such as an alkali halide or barium nitrate; and a relatively low work function metal collector element 13 which may be a metal such as copper, magnesium, zinc or aluminum.

An electrical load device 14 is connected between elements 11 and 13.

It should be understood that although the material selected for the embodiment as described above are referred to as having a relatively high work function for the cathode element and a relatively low work function for the anode element, the determining factor for selection of materials to be used in constructing a diode according to the present invention is the relative voltage barrier between the cathode element and the insulator or semiconductor element and the voltage barrier between the insulating or semiconductor element and the anode element of the diode. It is conceivable, that there may be a selection of materials for the three elements of the diode which would result in having the proper ratio of voltage barriers to result in an operative energy conversion device even though the work function of the third element may be greater than the work function of the first element.

The important consideration to the selection of materials is that the first voltage barrier at the common surface between the first element and the second element must be greater than the second voltage barrier at the second common surface between the second and the third element.

Further, it must be understood that surface treatment of the material selected will have significant impact upon voltage barriers.

In general, an insulator used as a second element will produce a more efficient device than a semiconductor due to the lower thermal conductivity of the insulating material.

It should be understood that although certain examples of materials have been given for the various elements 11, 12, 13, other materials having the appropriate characteristics may be used within the scope of the present invention.

When thermal energy 15 impinges upon cathode 11, electrons are excited to the point at which voltage barrier $V_B$ is exceeded. The voltage barrier is approximately the potential difference between the work function $\phi_1$ of the element 11 and the electron affinity $\chi$ of insulator (or semiconductor) element 12.

The energized electrons 31 pass through the conduction band 32 of insulator (or semiconductor) 12 and are collected by anode 13.

Some energy 16 in the form of heat will be lost from element 13 due to conversion inefficiency.

$\phi_1$ is the work function of cathode 11 and $\phi_2$ is the work function of anode 13.

By comparison, referring now to the prior art as shown in FIGS. 1A and 1B, it can be seen, that the prior art thermionic converter in which the cathode and anode elements are contained in a vacuum or gaseous space requires a greater amount of input thermal energy to cause electron flow from the cathode to the anode. Voltage barrier $V_B$ in the prior art device is greater than in an energy conversion device according to the present invention if the same materials are selected for the cathode and anode. There is no conduction band available for reduction of the voltage barrier and thus a greater input thermal energy is required to obtain a given output.

Figure 4A:
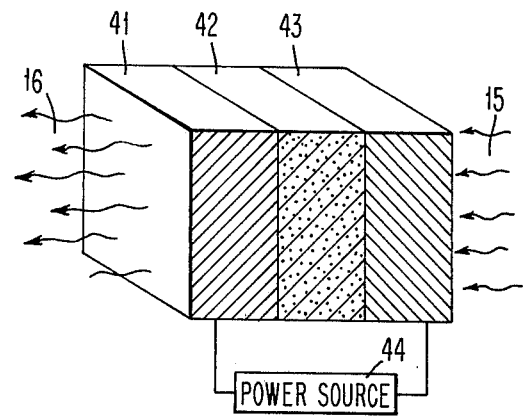
FIG. 4A is a diagram of an energy conversion device according to the present invention operating as an electrical to thermal energy converter.
Figure 4B:
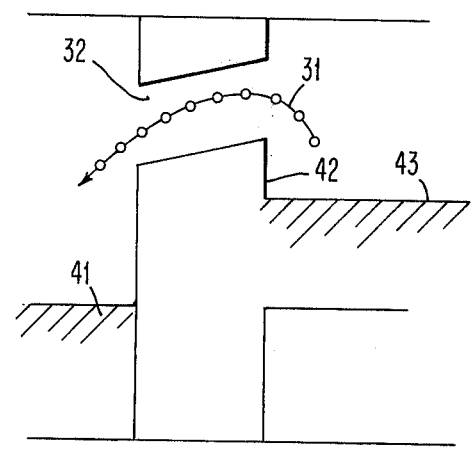
FIG. 4B is an energy diagram of an energy conversion diode according to the present invention operating as an electrical to thermal energy converter.

Referring now to FIGS. 4A and 4B, the energy conversion diode embodying the present invention as shown in FIG. 4A may be employed as a heat pump by applying a source of electrical energy 44 between elements 41 and 43. Heat energy is absorbed by element 43, electrons are excited and driven through the conduction band of element 42 by the applied source of electrical energy 44, and are collected by element 41. This causes thermal energy to be radiated by element 41. A device of this type could be used either to remove heat from an enclosed space by placing element 43 in the enclosed space and element 41 in the outside air or to heat an enclosed space by placing element 43 in the outside air and element 41 in the enclosed space.

Referring again to FIG. 2, a specific example of materials which might be used effectively according to the present is as follows:

Cathode 11 may be silver (Ag) which has a work function of 4.50eV, the semiconductor/insulator material 12 may be cadmium sulfide having a resistivity of one ohm-centimeter and a thermal conductivity of 3.71 × 10$^{-2}$ watts per centimeter per degree K and anode 13 being aluminum (Al) having a work function of 4.25eV. The barrier voltage between elements 11 and 12 in this configuration is equal to 0.40 volts and the barrier voltage between elements 12 and 13 in this configuration is equal to 0.20 volts for properly prepared surfaces. For a discussion of proper surface preparation see (A. M. Goodman, J. App. Phys. 35, 573 (1964).

The net current density is given by $J = J_H - J_C$ where H refers to the hot side (Ag) and C to the cold side (Al).

$J = A_H T_H^2 \exp(-\phi_{BH}/kT_H) - A_C T_C^2 \exp(-\phi_{BC}/kT_C)$ where $A_H$ = Richardson's constant for Ag
$A_C$ = Richardson's constant for Al
$k$ = Boltzmann's constant
$\phi_{BH}$ is the barrier height on the hot side and $\phi_{BC}$ is the barrier height on the cold side.

Assume $T_H = 500°$ K and $T_C = 250°$ K, CdS is used to construct element 12, and $A_H = A_C = 60$ amp/cm$^2$ − K$^2$ $J = (60)(500)^2 \exp(-1.16 \times 10^4 \, 0.4/0.5 \times 10^3) - (60)(250)^2 \exp(-1.16 \times 10^4 \, 0.2/0.25 \times 10^3)$ $J = (150 \times 10^5)(9.33 \times 10^{-5}) - (37.5 \times 10^5)(9.33 \times 10^{-5})$ $J = 140 \times 10^3 - 0.35 \times 10^3$ amp/cm$^2$ $J = 1.05 \times 10^3$ amp/cm$^2$ The open circuit voltage $V_{oc}$ to be expected approximately equals $V_{oc} = \phi_{BH} - \phi_{BC}$
$V_{oc} = 0.4 - 0.2$
$V_{oc} = 0.2$ volts Hence, the output power density is
$P_{out} = JV$
$P_{out} = (1.05 \times 10^3)(0.2)$
$P_{out} = 210$ watts/cm²

The efficiency is defined to be $$n = \frac{\text{Power out}}{\text{Power in}}$$

To find the efficiency "Power in" must be determined.

Energy conservation requires that the energy into the cathode (hot side) is equal to the energy leaving the cathode.

$$\text{Energy}_{out} = \text{Energy}_{in}$$
$$q_c + q_e + q_{cd} + q_{ra} = q_a + q_j + q_s$$

where $q_c$ = cooling of cathode due to electrons carrying energy away $q_e$ = latent heat of evaporation of electrons from cathode $q_{cd}$ = heat carried away by conduction through insulator (or semiconductor) and metallic leads $q_{ra}$ = net loss of heat from cathode to anode by radiation $q_a$ = energy anode supplies cathode by back emission $q_j$ = Joule heating in lead wires and insulator (or semiconductor), half of which goes to cathode and half to anode $q_s$ = Power$_{in}$ needed for efficiency equation Now calculate these quantities.

$q_c = J_H (2kT_H)$
$q_e = J_H \phi_{BH}$
$q_{cd} = (T_H - T_C)(\lambda_1 A_1/A_H 1 + \lambda_I A_I/A_H d)$
where 1 = lead wires and d = insulator (semiconductor) thickness, $\lambda$ = thermal conductivity
$q_{ra}$ is approximately 0 for a temperature of 500 K
$q_a = J_C (\phi_{BH} + 2kT_C)$
$q_j = \frac{1}{2}(J_H - J_C)^2 (\rho_1 + \rho_I)$ where $\rho_1 + $ resistivity in conduction band of insulator (or semiconductor)

$P_{in} =$ $$J_H(\Phi_{BH} + 2kT_H) + (T_H - T_C)\frac{\lambda_I A_I}{A_H d} - J_C(\Phi_{BH} + 2kT_C) - \frac{1}{2}(J_H - J_C)^2 \rho_I$$

The effects of the lead wires have been neglected. Assume that the area of the cathode (or hot contact) $A_H$ is equal to the area of the insulator (or semiconductor) $A_I$ (for example, 1cm square). Further, assume that the thickness $d$ of the insulator (or semiconductor) is 1 cm. To arrive at a worse case calculation, disregard the two terms that are to be subtracted to find $P_{in}$. Therefore, $P_{in}$ is calculated as follows:

$P_{in} = J_H (\phi_{BH} + 2kT_H) + (T_H - T_C) \lambda_I/d$
$P_{in} = (1.40 \times 10^3)(0.4 + 0.09) + (2.5 \times 10^2)(3.71 \times 10^{-2})/1$
$P_{in} = 686 + 9$
$P_{in} = 695$ watts/cm Hence, the efficiency for the device described above is $$n = \frac{210}{695}$$

$n = 0.302$ or 30.2%

The maximum Carnot efficiency for a device operating between 500° K and 250° K is only 50% and the above device attains 60% of that maximum. The efficiency may be increased above 30% just by increasing the temperature of the cathode $T_H$ above 500° K.

The preceding mathematical calculation of efficiency is an idealized treatment of the problem which neglects several factors. However, these factors are not considered to be significant to the operation of the present invention.

Referring now to FIG. 5, interconnection of a plurality energy conversion diodes 10 is shown in which an output voltage of 6.0 volts is obtained.

Since the voltage of the energy conversion diode is effectively equal to the difference in the barrier heights of the two junctions of the diodes, in the example given, the open circuit voltage would be 0.20 volts.

Therefore, to achieve a six volt open circuit output, thirty individual energy conversion diodes 110, 120, 130 . . . 400, are connected in a series configuration to achieve the desired output voltage.

While the invention has been shown with respect to preferred embodiments, thereof, it will be understood by those skilled in the art that various changes in material and structure may be made without departing from the scope or intent of the invention as defined by the following claims.

What is claimed is:

1. An energy conversion device for conversion between thermal energy and electrical energy comprising:
   A first element having a partially filled conduction band;
   A second element joined to said first element along a first common surface thereof said second element having a conduction band separated from a valance band by an energy gap;
   There being a first voltage barrier at said first common surface between said first element and said second element; and
   A third element joined to said second element along a second common surface, said third element having a partially filled conduction band, there being a second voltage barrier at said second common surface between said second element and said third element;
   Said first voltage barrier being greater than said second voltage barrier.

2. A device according to claim 1 wherein said second element comprises an insulating material.

3. A device according to claim 2 wherein said insulating material is cadmium sulfide.

4. A device according to claim 1 wherein said first and third elements are metals.

5. A device according to claim 4 wherein said first element is comprised of silver and said third element is comprised of aluminum.

6. A device according to claim 1 wherein said second element comprises a semiconductor material.

7. A device according to claim 6 wherein said semiconductor material is gallinium arsenide.

8. A device according to claim 1 wherein the temperature of the thermal energy impinging upon said first element is in the range of 350° Kelvin to 750° Kelvin.

9. A device according to claim 1 further comprising:
Means for supplying a potential between said first and third elements to cause said third element to absorb heat from the ambient atmosphere and emit electrons which exceed a voltage barrier between said third element and said second element causing electrons that have been injected into the conduction band of said second element to be displaced and flow to said first element causing heat to be radiated by said first element.

10. A device according to claim 9 wherein said first element is comprised of silver, said second element is an insulating material and said third element is comprised of aluminum.

11. An energy conversion device for conversion between thermal energy and electrical energy, comprising:

A first element having a first thermionic work function;

A second element joined to said first element along a first common surface thereof, said second element having a conduction band separated from a valance band by an energy gap; and A third element joined to said second element, along a second common surface said third element having a second thermionic work function; wherein said first thermionic work function is greater than said second thermionic work function; and Wherein thermal energy impinging upon said first element excites electrons to exceed a voltage barrier between said first element and said second element and displace electrons already injected into the conduction band of said second element to said third element to produce a voltage difference between said first and third elements.

12. A device according to claim 11 wherein said second element comprises an insulating material.

13. A device according to claim 11 wherein said second element comprises a semiconductor material.

14. A device according to claim 11 further comprising:
Means for supplying a potential between said first and third elements to cause said third element to absorb heat from the ambient atmosphere and emit electrons which exceed a voltage barrier between said third element and said second element causing free electrons that have been injected into the conduction band of said second element to be displaced and flow to said first element causing heat to be radiated by said first element.

* * * * *